United States Patent [19]
Takahashi

[11] Patent Number: 5,199,000
[45] Date of Patent: Mar. 30, 1993

[54] SEMICONDUCTOR MEMORY CIRCUIT HAVING SWITCHED VOLTAGE SUPPLY FOR DATA BUS LINES

[75] Inventor: Hiroyuki Takahashi, Tokyo, Japan
[73] Assignee: NEC Corporation, Tokyo, Japan
[21] Appl. No.: 675,836
[22] Filed: Mar. 27, 1991
[30] Foreign Application Priority Data
  Mar. 27, 1990 [JP]  Japan .................... 2-78112
[51] Int. Cl.$^5$ ........................... G11C 11/413
[52] U.S. Cl. ................. 365/189.09; 365/189.11; 365/190; 365/225.6
[58] Field of Search ............... 365/189.01, 189.09, 365/189.11, 190, 225.6

[56] References Cited
U.S. PATENT DOCUMENTS 5,010,521  4/1991  Matsui ................... 365/189.01
5,050,127  9/1991  Mitsumoto et al. ......... 365/189.09

Primary Examiner—Siegfried H. Grimm
Attorney, Agent, or Firm—Sughrue, Mion, Zinn, Macpeak & Seas

[57] ABSTRACT

A semiconductor memory circuit comprises a plurality of memory cells each connected to a corresponding word line and a corresponding pair of digit lines. The pair of digit lines are pulled up through a pair of load transistors, respectively, and connected through a pair of gate transistors to a corresponding pair of data bus lines, respectively, which are in turn connected to a sense amplifier and pulled down through a pair of driving transistors, respectively. A voltage supply circuit is provided which includes a voltage divider circuit composed of series-connected dummy transistors having the same characteristics as those of the load, gate and driving transistors which cooperate to determine a potential on the pair of data bus lines when the pair of digit lines and the pair of data bus lines are selected. On the basis of a reference voltage generated by the voltage divider circuit, the voltage supply circuit operates to generate a voltage to be supplied to the pair of data bus lines when the pair of digit lines and the pair of data bus lines are not selected. The voltage generated by the voltage supply circuit is supplied to the pair of digit lines or the pair of data bus lines through a switch circuit which is turned on when the pair of digit lines and the pair of data bus lines are not selected.

6 Claims, 6 Drawing Sheets

SEMICONDUCTOR MEMORY CIRCUIT HAVING SWITCHED VOLTAGE SUPPLY FOR DATA BUS LINES

BACKGROUND OF THE INVENTION

1. Field of the invention

The present invention relates to a semiconductor memory circuit, and more specifically to a semiconductor memory circuit configured so that information stored in a memory cell connected to a selected word line and a selected pair of digit lines is transferred to a sense amplifier through a switch circuit connected to the selected pair of digit lines, and through one or several stages of data bus lines for collecting information on a plurality of digit line pairs.

2. Description of related art

In conventional semiconductor memory circuits, each memory cell is connected to a pair of digit lines respectively pulled up by a pair of load transistors. The pair of digit lines are respectively connected through a pair of gate transistors to a pair of data bus lines, which are in turn connected to a sense amplifier and are also connected to a pair of driving transistors, respectively.

When a memory cell is selected, the pair of gate transistors connected to the digit line pair connected to the selected memory cell are turned on, and the pair of driving transistors connected to the data bus lines connected to the turned-on gate transistors are also turned on. In this condition, data is read out of the selected memory cell.

When data is read out of the memory cell, a data bus line potential, namely an input potential of the sense amplifier is determined by a conductivity ratio of the load transistors, the gate transistors, and the driving transistors. On the other hand, when the memory cell is in a non-selected condition, the corresponding gate transistors and the corresponding driving transistors are turned off, so that the data bus line potential is determined by auxiliary transistors which are provided for each of data bus line pair and which are ceaselessly maintained in an on condition. In other words, a standby current is flowed by these auxiliary transistors.

With this arrangement, data can be read out from a selected memory cell at a high speed by previously setting the data bus potential of the non-selection time at the same level as that of the selection time, by means of the auxiliary transistors. In an actual operation, however, off-timings of the gate transistors and the driving transistors after the reading of the memory cell has been completed are liable to deviate from each other. If the deviation of the off-timing between the gate transistors and the driving transistors becomes large, the data bus potential in a half-selected condition will transiently and rapidly change toward a voltage supply voltage. A a result, a long time becomes required for restoring an appropriate voltage after it becomes a complete non-selected condition, since a driving power of the permanent-on auxiliary transistors is small. On the other hand, if the data bus is selected in a condition in which the data bus potential of the non-selection time is greatly deviated from that of the selection time, a time for restoring the selection potential is required. As a result, a time required until it enters a normal sense amplifier operation will decrease an access speed.

In order to rapidly bring the potential of the non-selected data bus line to the set level, it is considered to increase a current driving capacity of the permanent-on auxiliary transistors. However, this is not preferable, since it results in increase of consumption power of the memory circuit.

In addition, since the circuit for setting the potential of the selected data bus and the circuit for setting the potential of the non-selected data bus are respectively formed of transistors having different shapes and powers, a difference between the selection time potential and the non-selection time potential is liable to occur due to variations in characteristics attributable to a manufacturing process.

SUMMARY OF THE INVENTION

Accordingly, it is an object of the present invention to provide a semiconductor memory circuit which has overcome the above mentioned defect of the conventional one.

Another object of the present invention is to provide a semiconductor memory circuit capable of realizing a stable and high speed access operation with a small power consumption.

The above and other objects of the present invention are achieved in accordance with the present invention by a semiconductor memory circuit comprising a plurality of memory cells each connected to a corresponding word line and a corresponding pair of digit lines, the pair of digit lines being connected through a switch circuit to a corresponding pair of data bus lines, which are in turn connected to a sense amplifier. The semiconductor memory circuit also includes a voltage supply circuit composed of circuit elements having the same characteristics as that of circuit elements included in a circuit for determining a potential on the pair of data bus lines when the pair of digit lines and the pair of data bus lines are selected. The voltage supply circuit operates to generate, on the basis of the potential on the pair of data bus lines when the pair of digit lines and the pair of data bus lines are selected, a voltage to be applied to the pair of data bus lines when the pair of digit lines and the pair of data bus lines are not selected. The voltage generated by the voltage supply circuit is supplied to the pair of digit lines or the pair of data bus lines through another switch circuit which is turned on when the pair of digit lines and the pair of data bus lines are not selected.

With the above mentioned arrangement, when the pair of digit lines and the pair of data bus lines are not selected, the pair of data bus lines are clamped to the voltage generated by the voltage supply circuit. In addition, the voltage generated by the voltage supply circuit can be designed to show a variation similar to the variation in the selection time data bus potential caused by variations in characteristics attributable to a manufacturing process. Therefore, the selection time data bus potential and the non-selection time data bus potential do not relatively sustain influence of the variations in characteristics attributable to a manufacturing process.

The above and other objects, features and advantages of the present invention will be apparent from the following description of preferred embodiments of the invention with reference to the accompanying drawings.

DESCRIPTION OF THE PREFERRED EMBODIMENTS

Figure 1:
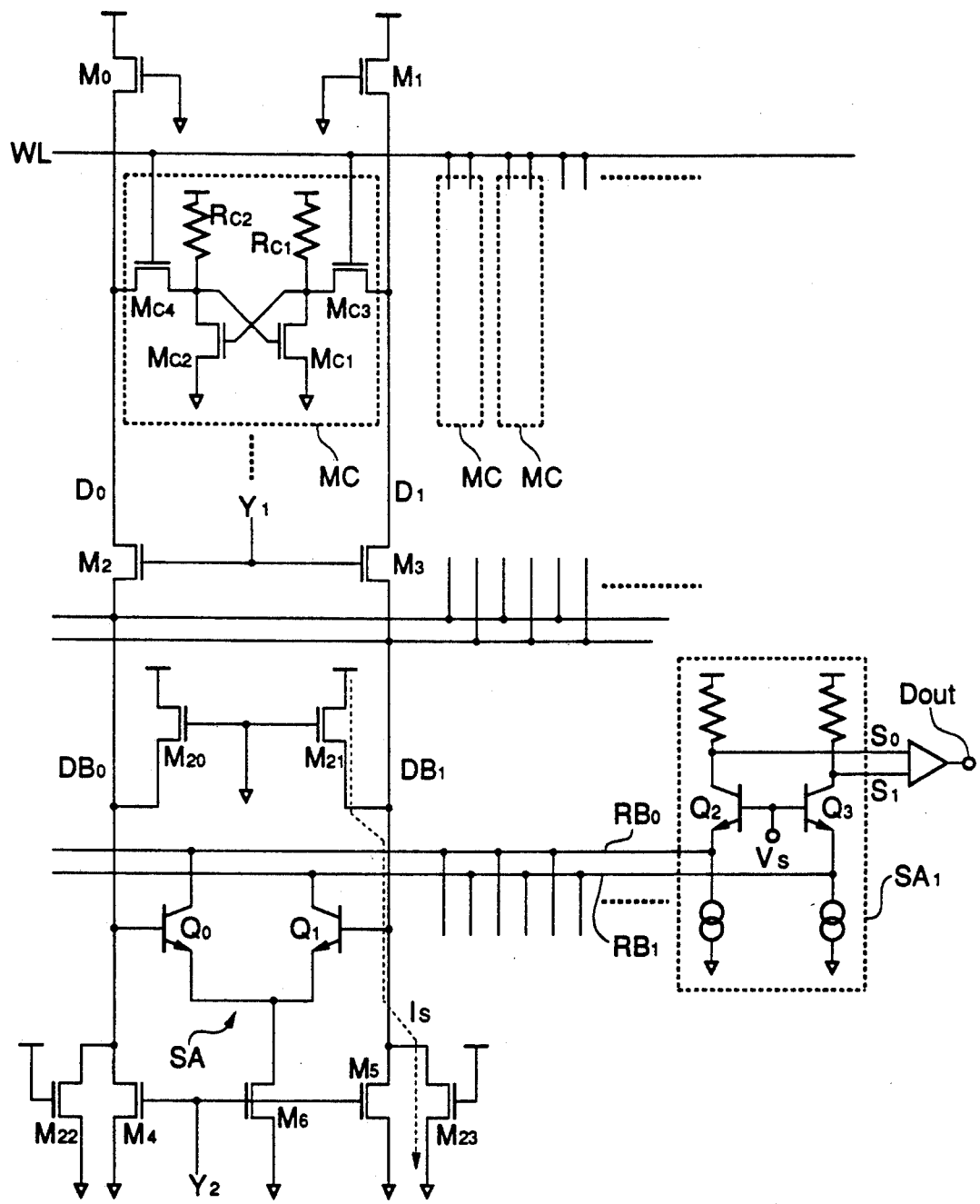
FIG. 1 is a circuit diagram of a conventional semiconductor memory circuit.

Referring to FIG. 1, there is shown a circuit diagram of a conventional semiconductor memory circuit.

In the shown conventional semiconductor memory circuit, a memory cell MC includes a flipflop type information hold circuit composed of NMOS (N-channel MOS) transistors $M_{C1}$ and $M_{C2}$ and resistors $R_{C1}$ and $R_{C2}$ connected as shown, and transfer gates of NMOS transistors $M_{C3}$ and $M_{C4}$ connected between the memory cell and a pair of digit lines $D_0$ and $D_1$. Gates of the NMOS transistors $M_{C3}$ and $M_{C4}$ are connected to a word line WL, which is selected by a word decoder (not shown).

The digit lines $D_0$ and $D_1$ are connected to load PMOS (p-channel MOS) transistors $M_0$ and $M_1$ for generating a potential difference between the pair of digit lines $D_0$ and $D_1$ dependently upon a current flowing out from the memory cell. The digit lines $D_0$ and $D_1$ are also connected to transfer gate PMOS transistors $M_2$ and $M_3$ for transferring information to a sense amplifier SA. A digit line selection signal Y1 is applied to the gates of the PMOS transistors $M_2$ and $M_3$ so that the pair of digit lines $D_0$ and $D_1$ are selected and information is transferred to data bus lines $DB_0$ and $DB_1$. NMOS transistors $M_4$ and $M_5$ are connected to the data bus lines $DB_0$ and $DB_1$, respectively. When these NMOS transistors $M_4$ and $M_5$ are turned on by a selection signal Y2, the data bus lines $DB_0$ and $DB_1$ are brought to a set potential (of a selection time) which is determined by a conductivity ratio of the PMOS transistors $M_0$, $M_1$, $M_2$ and $M_3$ and the NMOS transistors $M_4$ and $M_5$, so that the data bus is selected. As a result, potentials appearing on the data bus lines $DB_0$ and $DB_1$ are respectively applied to gates of bipolar transistors $Q_0$ and $Q_1$, which are connected to form a differential amplifier.

At the same time, an NMOS transistor $M_6$, which is connected as an emitter coupled logic current source to the commonly connected emitters of the bipolar transistors $Q_0$ and $Q_1$, is turned on by the selection signal Y2, so that the sense amplifier SA is brought into a selected or operating condition. Collectors of the bipolar transistors $Q_0$ and $Q_1$ of the sense amplifier SA are respectively connected to read bus lines $RB_0$ and $RB_1$, which constitute common collector lines for the sense amplifier SA and other sense amplifiers (not shown). Therefore, the read information is transferred through the read bus lines $RB_0$ and $RB_1$ to a current-voltage converter SA1 in the form of a current difference produced by the selected sense amplifier.

The current-voltage converter SA1 includes a pair of bipolar transistors $Q_2$ and $Q_3$ having commonly connected bases, so that a difference of emitter current is converted to a voltage difference by resistors connected to collectors of these bipolar transistors $Q_2$ and $Q_3$. The voltage difference is outputted through an output buffer to an output terminal Dout.

In the above mentioned circuit, and operating potential range of the selected data bus lines DB0 and DB1, which is an input of the sense amplifier SA, is determined by a conductivity ratio of the load PMOS transistors $M_0$ and $M_1$, the transfer gate PMOS transistors $M_2$ and $M_3$, and the driving NMOS transistors $M_4$ and $M_5$. Generally, the operating potential range of the selected data bus lines DB0 and DB1 is on the order of about −2.0 V to about −2.5 V. On the other hand, in a non-selected condition, the MOS transistors $M_2$ to $M_5$ are turned off, so that the data bus potential is determined by MOS transistors $M_{20}$, $M_{21}$, $M_{22}$ and $M_{23}$ which are provided for each data bus line pair and which are ceaselessly maintained in an on condition. In other words, a standby current Is flowed by these MOS transistors $M_{20}$, $M_{21}$, $M_{22}$ and $M_{23}$.

For writing, one of the selected pair of digit lines is brought to a lowest potential, and one of the pair of transistors of the flipflop of the memory cell MC is turned off.

In the above mentioned semiconductor memory circuit, the data can be read out at a high speed in the selection operation by setting the data bus potential during the non-selection time at the same level as that of the selection time. In an actual operation, however, off-timings of the digit line selection signal Y1 and the data bus line selection signal Y2 are liable to deviate from each other. If the deviation of the off-timing between the selection signals Y1 and Y2 becomes large (for example, on the order of about 1 nanosecond), the data bus potential in a half-selected condition will transiently and rapidly change toward a voltage supply voltage $V_{CC}$ or $V_{EE}$, as shown in a dotted line in FIGS. 3A and 3B. In addition, a long time (about several tens nanoseconds or more) is required for restoring an appropriate voltage after it becomes a complete non-selected condition, since the driving power of the permanent-on MOS transistor provided for each data bus line so as to set the data bus potential is small. On the other hand, if the data bus is selected in a condition in which the data bus potential during the non-selection time is greatly deviated from that of the selection time (for example, by about ±1 V or more), a time for restoring the selection potential is required. As a result, a time required until it enters a normal sense amplifier operation will decrease an access speed.

In order to rapidly bring the data bus line potential of the non-selected condition to the set level, a current driving capacity of the permanent-on MOS transistors should be increased. This will result in increase of the standby current in each data bus line. Namely, this will greatly increase a consumption power in a large scale integrated circuit. For example, in a stack RAM (random access memory) of 256 Kbits or 1 Mbits, since the number of the data bus lines is on the order of 128 or 256, an increase of 50 μA in the standby current will result in an increase of 6 mA to 12 mA of a power supply current.

In addition, the circuit for setting the potential of the selection time and the circuit for setting the potential of the non-selection time are respectively formed of transistors having different shapes and powers, a difference between the selection time potential and the non-selection time potential is liable to occur due to variations in characteristics attributable to a manufacturing process.

Figure 2:
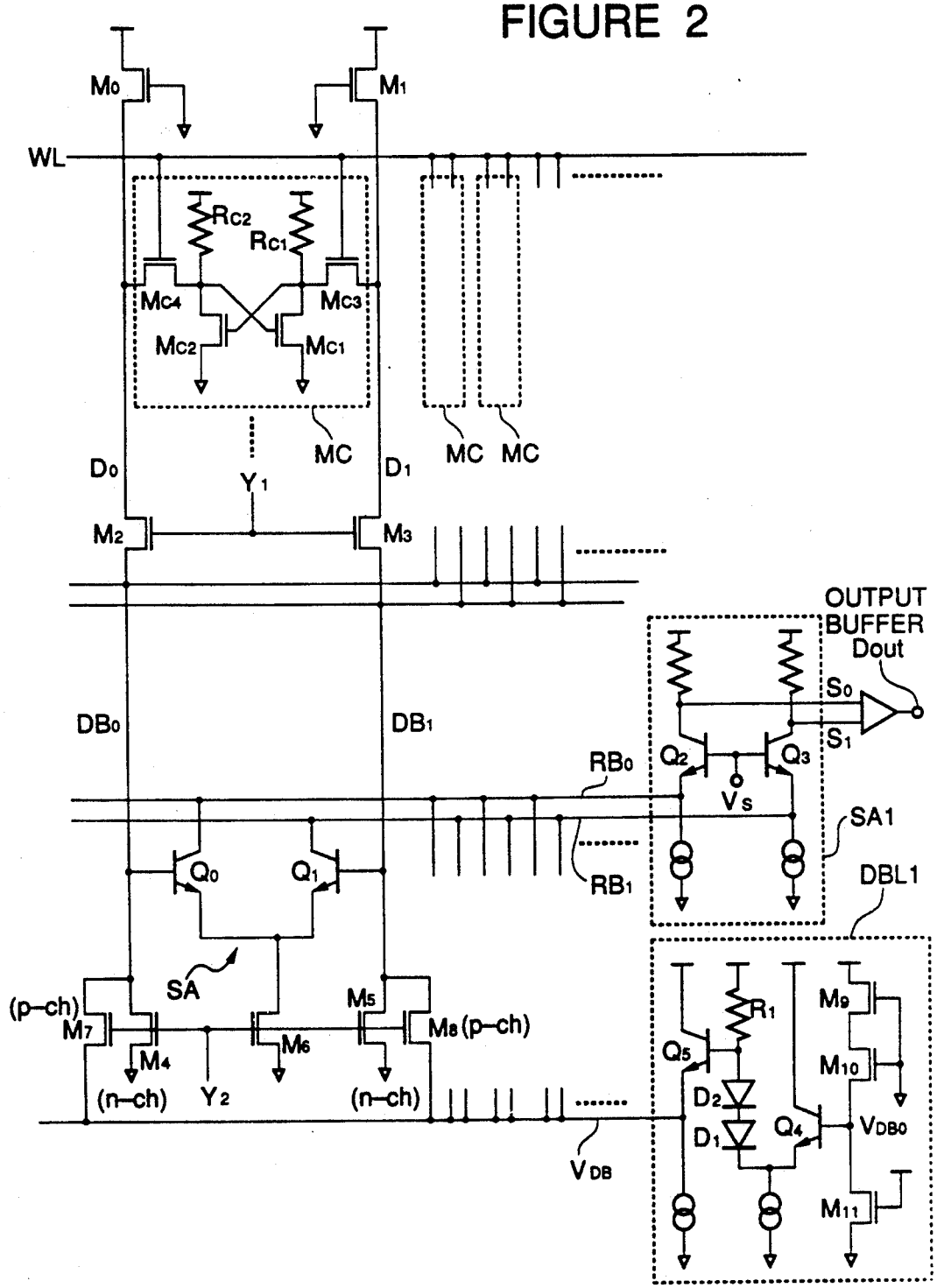
FIG. 2 is a circuit diagram of a first embodiment of the semiconductor memory circuit in accordance with the present invention.
Figure 3A:
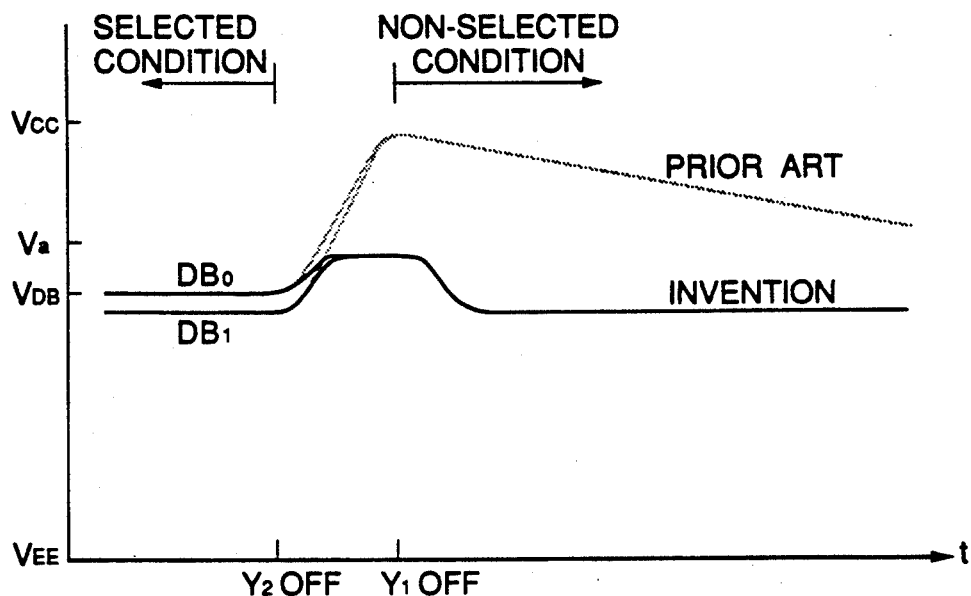
FIGS. 3A and 3B are timing charts showing the voltage change in time in a data bus switching over operation.
Figure 3B:
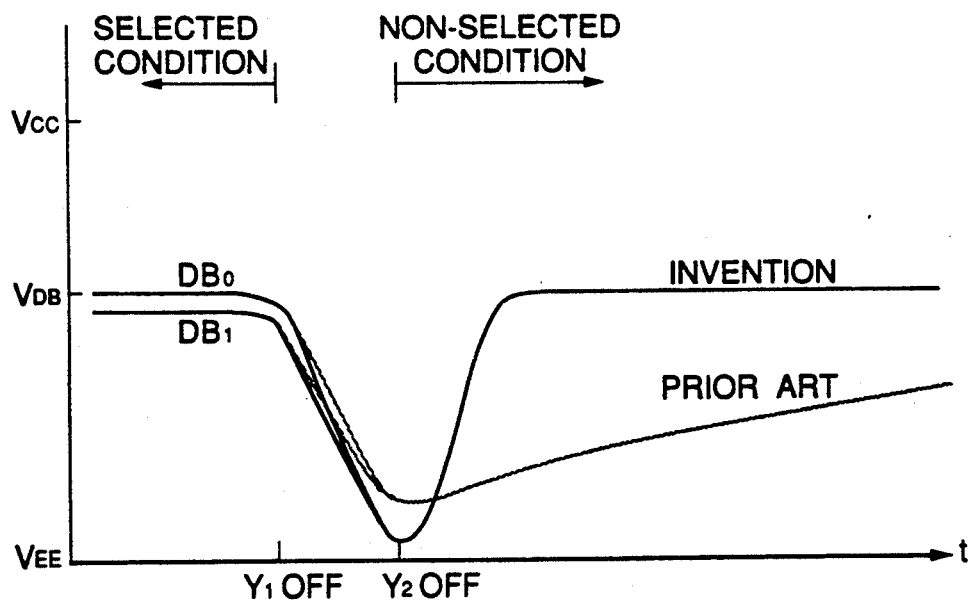

Referring to FIG. 2, there is shown a circuit diagram of a first embodiment of the semiconductor memory circuit in accordance with the present invention. In addition, FIGS. 3A and 3B show a voltage change in time in a data bus switching over operation of the semiconductor memory circuit shown in FIG. 2. In FIG. 2, elements similar to those shown in FIG. 1 are given the same Reference Signs, and explanation thereof will be omitted for simplification of description.

The semiconductor memory circuit shown in FIG. 2 additionally comprises a voltage supply circuit DBL1 including three dummy transistors $M_9$, $M_{10}$ and $M_{11}$ having the same power and the same shape as those of the three MOS transistors $M_0$ ($M_1$), $M_2$ ($M_3$) and $M_4$ ($M_5$) which determine the data bus potential at the selection time. These dummy transistors $M_9$, $M_{10}$ and $M_{11}$ are connected in series for generating a reference voltage $V_{DB0}$ which is the same as the data bus potential of the selection time. This reference voltage $V_{DB0}$ is connected to a base of a bipolar transistor $Q_4$ which constitutes an emitter follower. A voltage supply voltage $V_{CC}$ is connected to an emitter of the bipolar transistor $Q_4$ through a resistor R1 and two diodes $D_1$ and $D_2$ in a forward direction, so that a potential higher than an emitter potential of the bipolar transistor $Q_4$ by 2 $V_f$ (where $V_f$ is a forward direction voltage in a PN junction of each diode) is applied to a base of a bipolar transistor $Q_5$ which constitutes an output emitter follower. Thus, an output voltage $V_{DB}$ generated by the voltage supply circuit DBL1 substantially becomes equal to $V_{DB0}$ and $V_{DB1}$.

With the above mentioned arrangement, variation in the data bus voltage caused by variations in characteristics attributable to a manufacturing process will substantially relatively occur between the selection time and the non-selection time. A voltage supply circuit current required for clamping the non-selection time data bus potential to a clamp level given by the output voltage $V_{DB}$ generated by the voltage supply circuit DBL1 is only a current of the voltage supply circuit DBL1 itself, and therefore, is on the order of about 1 mA to 2 mA. This is remarkably small in comparison with about several tens milliamperes required in the case of increasing the standby current for each data bus line in the conventional semiconductor memory circuit.

In order to bring the potentials of the data bus lines $DB_0$ and $DB_1$ at the non-selection time into the output voltage $V_{DB}$ generated by the voltage supply circuit DBL1, the output voltage $V_{DB}$ generated by the voltage supply circuit DBL1 is connected to the data bus lines $DB_0$ and $DB_1$ through PMOS transistors $M_7$ and $M_8$, respectively. The selection signal Y2 for the data bus is applied directly to gates of the PMOS transistors $M_7$ and $M_8$. Therefore, at the non-selection time, namely when the data bus driving NMOS transistors $M_4$ and $M_5$ are off, the PMOS transistors $M_7$ and $M_8$ are on without exception, so that the data bus lines $DB_0$ and $DB_1$ are clamped to the output voltage $V_{DB}$ generated by the voltage supply circuit DBL1.

Now, a data bus switching-over operation in the semiconductor memory circuit shown in FIG. 2 will be described with reference to FIGS. 3A and 3B.

When the data bus line in the selection condition is brought to the non-selection condition, the selection signals Y1 and Y2 are turned off so that the MOS transistors $M_2$, $M_3$, $M_4$ and $M_5$ are turned off. In fact, however, the off-timing of the digit line selection signal Y1 and the off-timing of the data bus line selection signal Y2 are liable to deviate from each other.

As shown in FIG. 3A, when the off-timing of the digit line selection signal Y1 is delayed from the off-timing of the data bus line selection signal Y2, the data bus potential rises toward a potential Va determined by dividing a voltage difference $V_{CC}-V_{DB}$ by a conductivity ratio of the transistors $M_0$ ($M_1$), $M_2$ ($M_3$), and $M_7$ ($M_8$). In general, the data bus potential of the selection time is about $-2$ V ($V_{CC}=0$ V), and on the other hand, the voltage Va is $-1$ V to $-1.5$ V.

In the conventional semiconductor memory circuit having the permanent-on transistor supplying the standby current, the voltage difference $V_{CC}-V_{DB}$ is divided by a conductivity ratio of the transistors $M_0$ ($M_1$), $M_2$ ($M_3$), and $M_{22}$ ($M_{23}$). However, since the current drive power of the transistors $M_{22}$ ($M_{23}$) is small, the voltage Va rises to almost $V_{CC}$.

When the selection signal Y2 is actually turned off, the potential of the data bus lines $DB_0$ and $DB_1$ starts to change toward the non-selection time voltage. At this time, since the transistors $M_7$ ($M_8$) of the shown embodiment and the transistors $M_{22}$ ($M_{23}$) of the conventional circuit are greatly differnt in discharge capability, the shown embodiment and the conventional circuit have greatly different time constants. For example, the shown embodiment needs only a time on the order of several nanoseconds until the potential of the data bus lines $DB_0$ and $DB_1$ is actually brought to the output voltage $V_{DB}$ generated by the voltage supply circuit DBL1, but the conventional circuit requires a time of 30-ns to 50-ns.

As shown in FIG. 3B, when the off-timing of the data bus line selection signal Y2 is delayed from the off-timing of the digit line selection signal Y1, the data bus potential rapidly drops toward a low level voltage supply voltage $V_{EE}$. As soon as the selection signal Y2 is turned off, the PMOS transistors $M_7$ ($M_8$) are turned on, so that the data bus potential rapidly returns to the set level, namely to the clamp level, with a short time (for example, about 1 ns to 2 ns).

In the conventional semiconductor memory circuit, the drop speed of the data bus line potential is slightly slowed by the permanent-on pull-up transistors $M_{20}$ and $M_{21}$. However, since the current driving power of the permanent-on pull-up transistors $M_{20}$ and $M_{21}$ is small, a restoring time of 40-ns to 60-ns is required after the selection signal Y2 is turned off until the data bus line potential is brought to the set or clamp level $V_{DB}$.

If the data bus line is brought into the selection condition when the non-selection time potential of the data bus line is not substantially the same as the selection time potential of the data bus line, an acess is delayed by a time required until the set voltage of the selection time is restored and the potential of the data bus line is brought into a range allowing a normal operation of the sense amplifier. For example, if the data bus line is about $-0.9$-V or more, the transistors $Q_0$ and $Q_1$ of the sense amplifier are brought into a saturated condition since the read bus lines $RB_0$ and $RB_1$ are about $-1.5$ V. On the other hand, if the data bus line is about $-2.4$-V or less (in the case of $V_{EE}=-4.0$ V), the source-drain voltage of the MOS transistor $M_6$ which functions as the current source for the sense amplifier SA becomes about 0.8-V or less. As a result, the current of the sense amplifier is decreased, and therefore, a delay occurs in a sense operation of the sense amplifier. These phenomena will remarkably appear when the cycle time for the selection operation is shortened. However, if the time for setting the non-selection time potential of the data bus line is sufficiently small (about 1-ns to 2-ns) in comparison with the cycle time for the selection operation, the above mentioned problems are no longer a problem. In addition, the influence caused by variations in characteristics attributable to a manufacturing process can be cancelled. Therefore, a stable and high speed switching operation can be realized.

Figure 4:
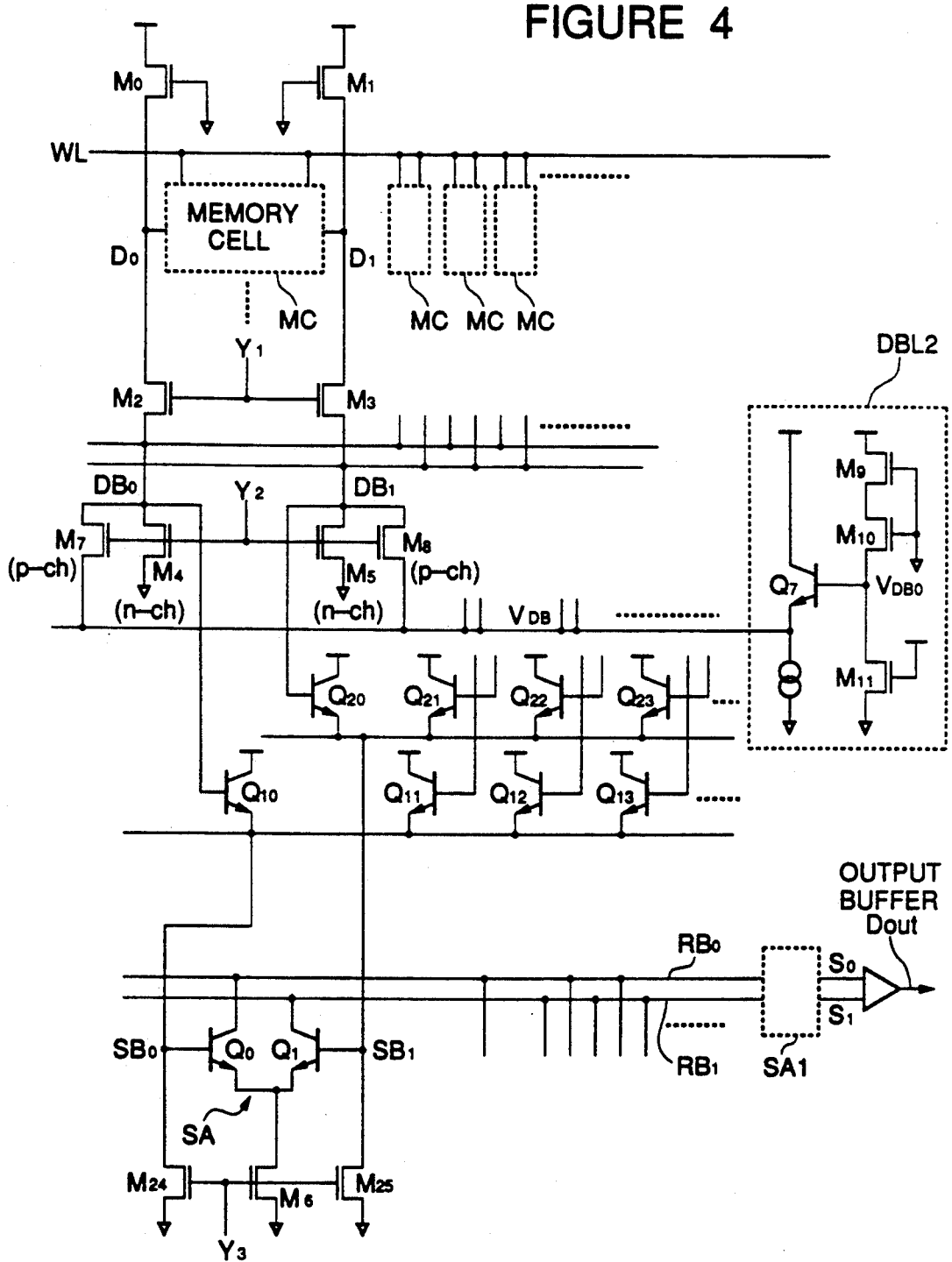
FIG. 4 is a circuit diagram of a second embodiment of the semiconductor memory circuit in accordance with the present invention.

Turning to FIG. 4, there is shown a second embodiment of the semiconductor memory circuit. In FIG. 4, elements similar to those shown in FIG. 2 are given the same Reference Signs, and explanation thereof will be omitted for simplification of description.

Similarly to the first embodiment, information read out from the memory cell to the pair of digit lines $D_0$ and $D_1$ is connected through the PMOS transistors $M_2$ and $M_3$ to a pair of first data bus lines $DB_0$ and $DB_1$. In this second embodiment, a second switch circuit for a multiplexer operation is located between the data bus lines $DB_0$ and $DB_1$ and the sense amplifier composed of the transistors $Q_0$, $Q_1$ and $M_6$. This second switching circuit includes bipolar transistors $Q_{10}$ to $Q_{13}$ having commonly connected emitters and bipolar transistors $Q_{20}$ to $Q_{23}$ having commonly connected emitters. Bases of the bipolar transistors $Q_{10}$ to $Q_{13}$ and $Q_{20}$ to $Q_{23}$ are connected to corresponding first data bus lines, as shown in FIG. 4.

The commonly connected emitters of the bipolar transistors $Q_{10}$ to $Q_{13}$ and the commonly connected emitters of the bipolar transistors $Q_{20}$ to $Q_{23}$ form a pair of second data bus lines $SB_0$ and $SB_1$, which are connected to the bases of the bipolar transistors $Q_0$ and $Q_1$ of the sense amplifier SA. As seen from the drawing, the bipolar transistors for the second data bus lines $SB_0$ and $SB_1$ and the bipolar transistors of the sense amplifier SA both are of an emitter coupled type, and therefore, the second data bus lines $SB_0$ and $SB_1$ and the sense amplifier SA are selected by turning on the MOS transistor $M_6$ and MOS transistors $M_{24}$ and $M_{25}$ (functioning as a current source), by means of a third selection signal Y3.

As seen from the above, by modifying the data bus into a two-stage structure, the number of sense amplifiers can be reduced, and a capacitance loaded to the read bus $RB_0$ and $RB_1$ can be greatly decreased. In addition, since the second switch circuit is formed of a wired OR circuit composed of bipolar transistors having a high driving force, a data transmission time in the second switching circuit is as short as about 0.05-ns to 0.2 ns. For this and other reasons, the access speed can be greatly improved by about 2-ns or more.

In the second embodiment, the multiplexing operation of the second switch circuit is realized by a potential difference in the first data bus lines. Therefore, it is required to ensure that a potential of the nonselection side is sufficiently lower than the set potential of the selection side (by for example about 400-mV or less, namely, an operating margin of 300-mV and a data bus amplitude of 100-mV or less).

For this purpose, a constant voltage circuit DBL2 for generating a common data bus non-selection time potential $V_{DB}$ includes series-connected dummy transistors $M_9$, $M_{10}$ and $M_{11}$ for generating the reference potential $V_{DB0}$ equivalent to the selection time data bus line potential, and a bipolar transistor $Q_7$ having a base connected to receive the reference potential $V_{DB0}$ and forming an emitter follower, so that an emitter of the bipolar transistor $Q_7$ gives the set or clamp voltage $V_{DB}$ which is lower than the data bus line potential of the selection time by about 0.8 V. Therefore, this 0.8-V determines the potential difference between the selected first data bus lines and the non-selected first data bus line, independently upon the variations in characteristics attributable to a manufacturing process. This value of 0.8-V is sufficient as the base potential difference in the second switch circuit.

In the switching over operation of the first data bus lines, it is necessary to cause the data bus line potential to be rapidly brought to the set level of the selection time or the non-selection time. Particularly, in this second embodiment, change of the non-selected data bus line is very important, similarly to change of the selected data bus line. Even if the selected data bus line is quickly brought to the set voltage, if the non-selected data bus line is lowered to a potential which is lower than the set voltage of the selected data bus line by about 300-mV, the information on the first data bus will not be transferred to the second data bus.

As mentioned hereinbefore in connection with the first embodiment, the deviation in the off-timing between the selection signals Y1 and Y2 in the conventional semiconductor memory circuit causes a large delay in the reading time, since several tens nanoseconds are required to restore the potential of the non-selected data bus line to the appropriate level. In this embodiment, however, the change of the selected and non-selected first data bus lines to the respective appropriate levels are rapidly completed within a range of about 1-ns to 2 ns. The data bus can be selected without substantially delaying the information read out of a selected memory cell. Namely, a stable and high speed access can be realized.

Figure 5:
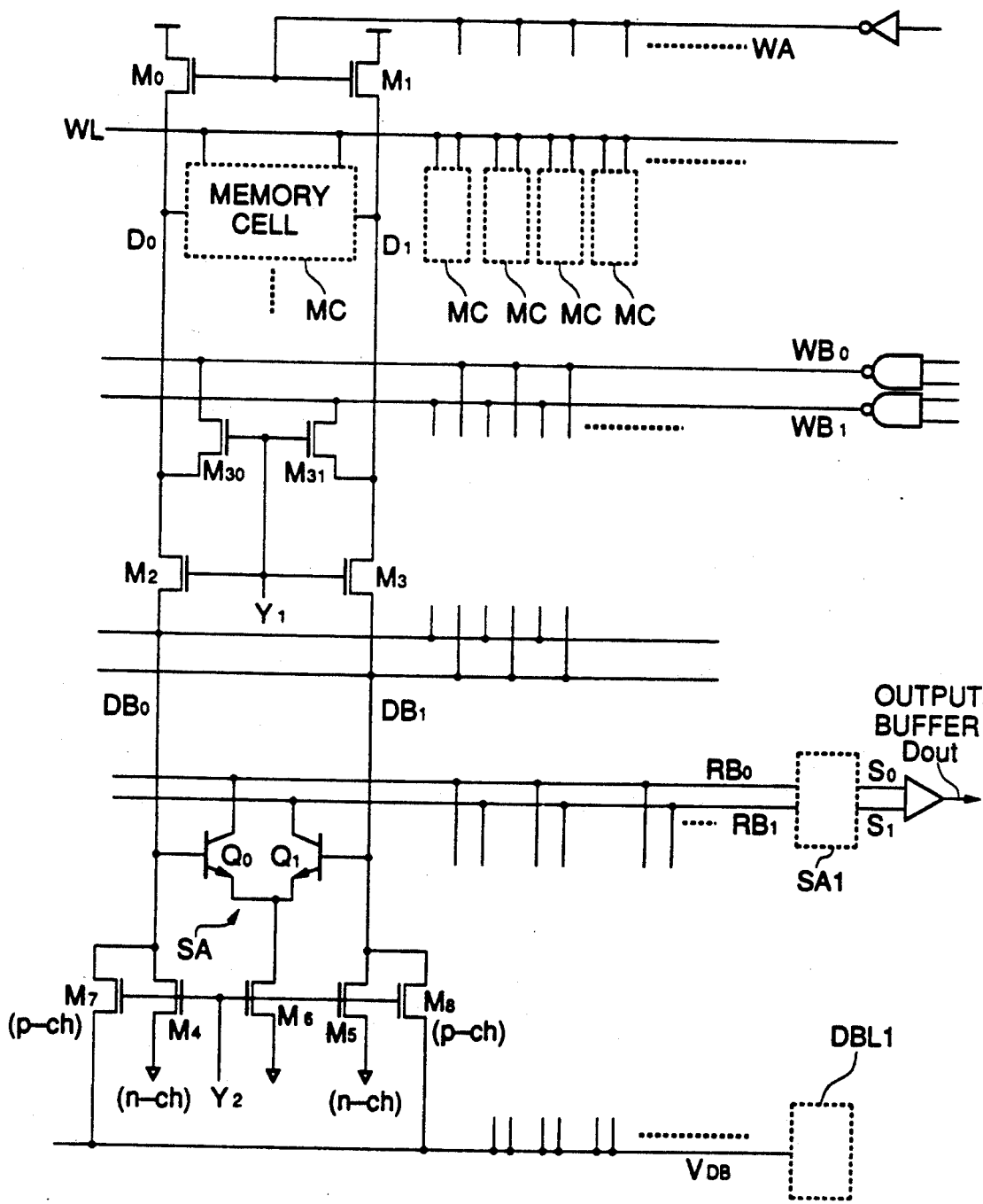
FIG. 5 is a circuit diagram of a third embodiment of the semiconductor memory circuit in accordance with the present invention.
Figure 6:
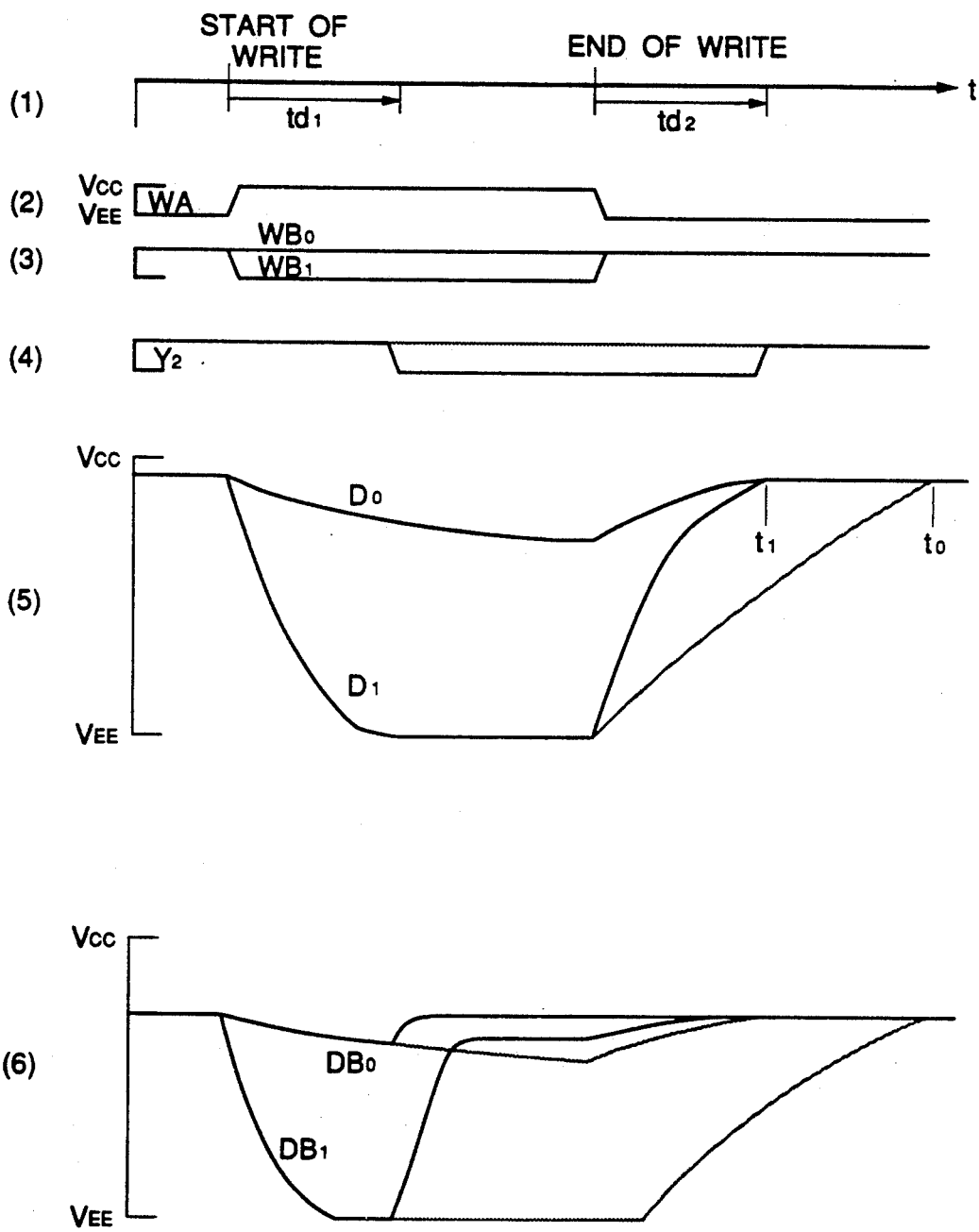
FIG. 6 is a timing chart showing the voltage change in time in a writing operation of the third embodiment shown in FIG. 5.

Referring to FIG. 5, there is shown a circuit diagram of a third embodiment of the semiconductor memory circuit in accordance with the present invention. In addition, FIG. 6 shows voltage change in time of various points in the case of a writing operation of the third embodiment shown in FIG. 5.

The third embodiment includes a writing circuit in addition to the first embodiment. The third embodiment includes a pair of MOS transistors M30 and M31 having common connected bases receiving the digit line selection signal Y1. The MOS transistors M30 and M31 are connected between the corresponding digit lines $D_0$ and $D_1$ and corresponding write data lines $WB_0$ and $WB_1$, respectively. Either of the write data lines $WB_0$ and $WB_1$ is brought to a lowest potential in accordance with data to be written. Here, assume that the write data line $WB_1$ is brought to the lowest potential. In addition, bases of the PMOS load transistors $M_0$ and $M_1$ are connected in common to receive a write signal WA.

At the same time as the write data line $WB_1$ is brought to the lowest potential, the PMOS load transistors $M_0$ and $M_1$ for the digit lines $D_0$ and $D_1$ are turned off in response to the write signal WA As a result, when a potential $V_{WB1}$ on the write data line $WB_1$ becomes less than $Y1 + V_T$ ($V_T$ is a threshold of the transistor M31), transistor M31 is turned on, and therefore, the potential on the digit line $D_1$ drops following the drop of the potential $V_{WB1}$ on the write data line $WB_1$. Here, since the load transistor $M_1$ is off, there is no transistor serving to pull up the digit line $D_1$ to the high level voltage supply voltage $V_{CC}$. Therefore, the potential on the digit line $D_1$ smoothly drops to the lowest potential with no pass-through current flowing from the high level voltage supply voltage $V_{CC}$ to the write data line $WB_1$. With this, data is written into the memory cell.

In a recovery operation after the writing, the MOS transistor $M_1$ is turned on at the same time as the write data line $WB_1$ is brought to a high level. Therefore, a charge current flows into the digit line D1 through the MOS transistors $M_1$ and $M_{31}$. After the MOS transistor $M_{31}$ is turned off, the charge current is supplied through only the MOS transistor $M_1$, so that the digit line D1 rises to the selection potential at the time of reading. In order to realize a high speed writing and a high speed recovery, it is necessary to quickly raise and drop the digit line potential. In ordinary cases, however, one digit line is connected with a few hundreds memory cells, and therefore, it can be said that several ten picofarads of capacitance is added to each one digit line. Therefore, it has become difficult to obtain a sufficient speed by only the transistors $M_{31}$ and $M_1$.

Now, a writing operation of the third embodiment will be described with reference to FIG. 6.

In the conventional memory, the data bus selection signal is not changed in the writing operation. However, in the third embodiment, the data bus selection signal Y2 selecting the data bus connected to the memory cell to be written is turned off with some delay time $t_{d1}$ after the write signals WA and WB are activated, so that all the data buses are brought into the non-selected condition. This delay time $t_{d1}$ of the turn-off of the data bus selection signal for bringing the data bus into the non-selection condition at the time of writing is set to extend until a timing which is later, by 2 ns to 3 ns or more, from a timing where the digit line D1 drops and the data is written to the memory cell. With this, the operation for dropping the potential of the digit line is facilitated by the NMOS transistor $M_5$ through the transfer gate MOS transistor $M_3$, and therefore, the writing operation can be speeded up.

On the other hand, a timing $t_1$ of the turn-on of the data bus selection signal for bringing the data bus into the selection condition at the time of recovery is set at a timing which is later, by 2 ns to 3 ns or more, from a timing where the potential of the digit line D1 rises and becomes substantially equal to the voltage $V_{DB}$. With this, the operation for pulling up the potential of the digit line is facilitated by the NMOS transistor $M_8$ through the transfer gate MOS transistor $M_3$, and therefore, the recovery operation can be speeded up. Namely, since the data bus potential has been already pulled up to the voltage $V_{DB}$ of $-1$ V to $-2$ V before the recovery operation starts, the data bus operates to pull up the digit line, in the contrary of the conventional operation in which the data bus is pulled up by the digit line. Therefore, the recovery operation, which had required 5 ns to 10 ns in the conventional example, can be shortened to about 2 ns to 4 ns (which is smaller than a half of the conventional recovery time) without additional recovery improving circuit.

The invention has thus been shown and described with reference to the specific embodiments. However, it should be noted that the present invention is in no way limited to the details of the illustrated structures but changes and modifications may be made within the scope of the appended claims.

I claim:

1. A semiconductor memory circuit comprising a plurality of memory cells each connected to a corresponding word line and a corresponding pair of digit lines, said pair of digit lines being connected through a switch circuit to a corresponding pair of data bus lines, which are in turn connected to a sense amplifier, the semiconductor memory circuit also including a voltage supply circuit composed of circuit elements having the same characteristics as that of circuit elements included in a circuit for determining a potential on said pair of data bus lines when said pair of digit lines and said pair of data bus lines are selected, said voltage supply circuit operating to generate, on the basis of the potential on said pair of data bus lines when said pair of digit lines and said pair of data bus lines are selected, a voltage to be applied to said pair of data bus lines when said pair of digit lines and said pair of data bus lines are not selected, the voltage generated by said voltage supply circuit being supplied to said pair of digit lines or said pair of data bus lines through another switch circuit which is turned on when said pair of digit lines and said pair of data bus lines are not selected.

2. A semiconductor memory circuit comprising a plurality of memory cells each connected to a corresponding word line and a corresponding pair of digit lines, said pair of digit lines being pulled up through a pair of load transistors, respectively, and connected through a pair of gate transistors to a corresponding pair of data bus lines, respectively, which are in turn connected to a sense amplifier and pulled down through a pair of driving transistors, respectively, the semiconductor memory circuit also including a voltage supply circuit which includes a voltage divider circuit composed of series-connected dummy transistors having the same characteristics as those of said load, gate and driving transistors which cooperate to determine a potential on said pair of data bus lines when said pair of digit lines and said pair of data bus lines are selected, said voltage supply circuit operating to generate, on the basis of a reference voltage generated by said voltage divider circuit, a voltage to be supplied to said pair of data bus lines when said pair of digit lines and said pair of data bus lines are not selected, the voltage generated by said voltage supply circuit is supplied to said pair of digit lines or said pair of data bus lines through a first switch circuit which is turned on when said pair of digit lines and said pair of data bus lines are not selected.

3. A semiconductor memory circuit claimed in claim 2 wherein said gate transistors have commonly connected gates receiving a digit line selection signal, so that said gate transistors are turned on when said pair of digit lines are selected, and said driving transistors have commonly connected gates receiving a data bus selection signal, so that said driving transistors are turned on when said pair of data bus lines are selected, and wherein said switch circuit includes a pair of transfer gate transistors connected between an output of said voltage supply circuit and said pair of data bus lines, respectively, gates of transfer gate transistors being connected in common to receive said data bus selection signal so that when said driving transistors are turned off, said transfer gate transistors are turned on whereby the voltage generated by said voltage supply circuit is supplied to said pair of data bus lines.

4. A semiconductor memory circuit claimed in claim 3 wherein said voltage supply circuit includes a first bipolar transistor in the form of an emitter follower having a collector connected to a high voltage supply voltage and a base connected to receive said reference voltage generated by said voltage divider circuit, a voltage shift circuit having a resistor and at least one diode connected in series between said high voltage supply voltage and said emitter of said first bipolar transistor, and a second bipolar transistor in the form of an emitter follower having a base connected to a connection node between said resistor and said at least one diode and an emitter giving said output of said voltage supply circuit.

5. A semiconductor memory circuit claimed in claim 3 wherein said pair of data bus lines are connected through a second switch circuit to a pair of common data bus lines which are in turn connected to said sense amplifier and wherein the voltage generated by said voltage supply circuit is supplied to said pair of data bus lines through said first switch circuit.

6. A semiconductor memory circuit claimed in claim 5 wherein said voltage supply circuit includes a bipolar transistor in the form of an emitter follower having a collector connected to a high voltage supply voltage and a base connected to receive said reference voltage generated by said voltage divider circuit, an emitter of said bipolar transistor giving said output of said voltage supply circuit.

* * * * *